United States Patent
Hsiao et al.

(10) Patent No.: US 6,281,133 B1
(45) Date of Patent: Aug. 28, 2001

(54) METHOD FOR FORMING AN INTER-LAYER DIELECTRIC LAYER

(75) Inventors: Hsi-Mao Hsiao, Hsinchu; Wen-Shan Wei, Taipei Hsien; Ming-Sheng Kuo, Hsinchu; H. C. Yu, Yi-Lan Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/393,049

(22) Filed: Sep. 9, 1999

(51) Int. Cl.$^7$ .................................................. H01L 21/302
(52) U.S. Cl. ..................... 438/706; 438/719; 438/723; 438/743
(58) Field of Search ..................... 438/692, 697, 438/706, 723, 743, 719, 624, 626

(56) References Cited

U.S. PATENT DOCUMENTS

| | | | |
|---|---|---|---|
| 5,399,533 | * | 3/1995 | Pramanik et al. ................... 438/624 |
| 5,552,346 | * | 9/1996 | Huang et al. ...................... 438/699 |
| 5,665,657 | * | 9/1997 | Lee ................................ 438/624 |
| 6,057,603 | * | 5/2000 | Dawson ............................ 257/758 |

* cited by examiner

Primary Examiner—Benjamin L. Utech
Assistant Examiner—Binh X. Tran
(74) Attorney, Agent, or Firm—Thomas, Kayden, Horstemeyer & Risley, LLP

(57) ABSTRACT

The invention describes a method for fabricating an inter-layer dielectric layer. In this method, a plurality of first polysilicon lines, a first inter-layer dielectric layer, and a plurality of second polysilicon lines are formed in sequence on the substrate. A second inter-layer dielectric layer is formed between the plurality of second polysilicon lines and entirely covers the plurality of second polysilicon lines. Afterwards, a spin-on glass layer is formed on the second inter-layer dielectric layer, and then, while using the upper surfaces of the second polysilicon lines as etch end points, the spin-on glass layer and the second inter-layer dielectric layer are etched back to entirely remove the spin-on glass layer and partially remove the second inter-layer dielectric layer over the second polysilicon lines. Subsequently, a cover layer is formed to cover the second polysilicon lines and the remainder of the inter-layer dielectric layer. Finally, an oxide layer is formed to cover the resulting structure.

24 Claims, 4 Drawing Sheets

METHOD FOR FORMING AN INTER-LAYER DIELECTRIC LAYER

BACKGROUND OF THE INVENTION

1. Field of the Invention

The invention relates to a method for forming an inter-layer dielectric layer, and more particularly, to a method for forming a second inter-poly dielectric layer.

2. Description of the Related Art

In a integrated circuit having a high integration, in addition to a first polysilicon layer used as word lines, there is at least a second polysilicon layer to form a functional structure such as bit lines or capacitors. When the second polysilicon layer is formed, an inter-poly dielectric (IPD) layer is then formed thereon to isolate from an upper device such as an interconnect or a third polysilicon layer. However, due to the second polysilicon layer having a greater thickness (especially when a capacitor is formed), a planarization process and an etching back process are normally performed to form a planarized second polysilicon layer.

FIG. 1A through FIG. 1C are schematic, cross-sectional views showing a conventional process for forming a second inter-poly dielectric layer according to the prior art.

Referring to FIG. 1A, a substrate 100 is provided, and then a first polysilicon layer 102, a first inter-layer dielectric layer 104 and a second polysilicon layer 106 are formed on the substrate 100. Then, a second IPD layer 108 is formed on the resulting structure. Due to the difference in height between the second polysilicon layer 106 and the first inter-layer dielectric layer 104, the second IPD layer 108 as formed has an undulating surface, as shown in FIG. 1A. Thus, a spin-on glass (SOG) layer 110 is further formed thereon to generate a uniform surface.

Referring to FIG. 1B, the SOG layer 110 and the second IPD layer 108 are etched back to entirely remove the SOG layer 110 and partially remove the second IPD layer 108; thus, the surface of the second IPD layer 108 is planarized.

Referring to FIG. 1C, a silicon nitride layer 114 and an oxide layer 116 are formed on the planarized second IPD layer 108 in sequence; thus, an inter-layer dielectric layer is completed. The distance from a top surface of the second polysilicon layer 106 to a top surface of the planarized second IPD layer 108 is denoted as a reference numeral 112.

However, according to the prior art, in the step of etching the SOG layer 110 and the second IPD layer 108 back, a time mode is adopted; that is, the processing time of etching is predetermined. Thus, once the schedule is completed, the etching is terminated.

The time mode is readily influenced by deviation in deposited thickness and improper control in etching rate. Thus, the desired thickness of the dielectric layer etched cannot be properly provided. Therefore, conventionally, the present method to prevent excessive etching is to deposit an assured thickness (the reference number 112 in FIG. 1B) in order to prevent the second IPD layer 108 from being lower than the surface of the second polysilicon layer 106 due to deviation in process. However, the assured thickness on the second polysilicon layer 106 increases difficulty in subsequently etching the dielectric layer because the etching depth is increased.

SUMMARY OF THE INVENTION

The invention provides an effective method of controlling the thickness of the second IPD layer. The method can prevent the second IPD layer from being lower than the second polysilicon layer due to deviation in process. In addition, increasing the thickness of the second IPD layer is not required; thus, the etching depth does not increase.

As described above, a method for forming an inter-layer dielectric layer is provided. A substrate is provided. Sequentially, first polysilicon lines, a first inter-layer dielectric layer, and a plurality of second polysilicon lines are formed on the substrate. A second inter-layer dielectric layer is formed between the second polysilicon lines and covers the second polysilicon lines. A spin-on glass layer is formed on the second inter-layer dielectric layer. Using upper surfaces of the second polysilicon lines as etch end points, the spin-on glass layer and the second inter-layer dielectric layer are etched back to entirely remove the spin-on glass layer and partially remove the second inter-layer dielectric layer over the second polysilicon lines. Subsequently, a cover layer is formed to cover the second polysilicon lines and the remainder of the inter-layer dielectric layer. An oxide layer is formed to cover the resulting structure.

It is to be understood that both the foregoing general description and the following detailed description are exemplary, and are intended to provide further explanation of the invention as claimed.

DESCRIPTION OF THE PREFERRED EMBODIMENTS

Figure 1A:
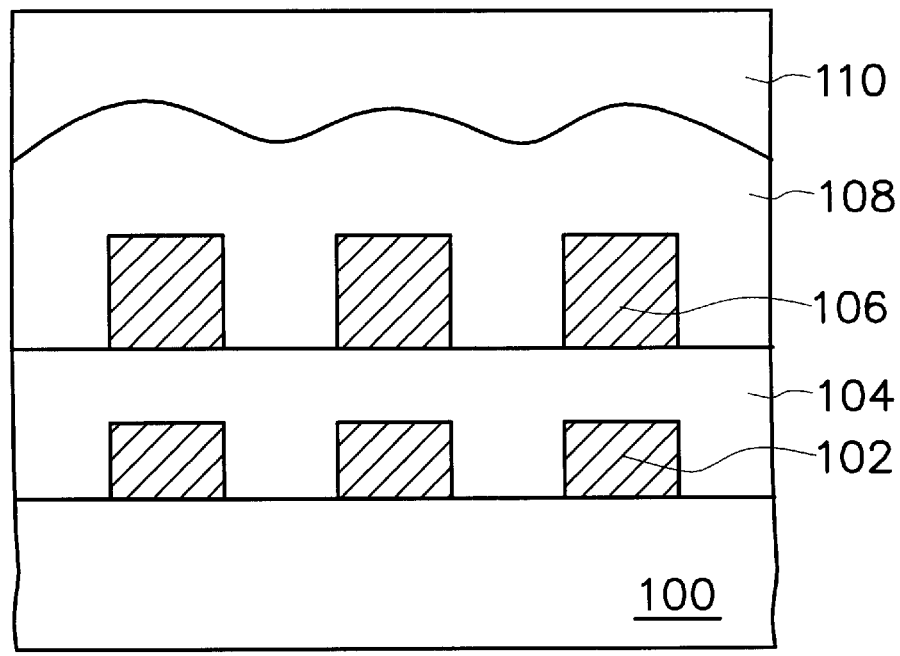
FIG. 1A through FIG. 1C are schematic, cross-sectional views showing a process for forming a inter-poly dielectric layer on a second polysilicon layer according to the prior art.
Figure 1B:
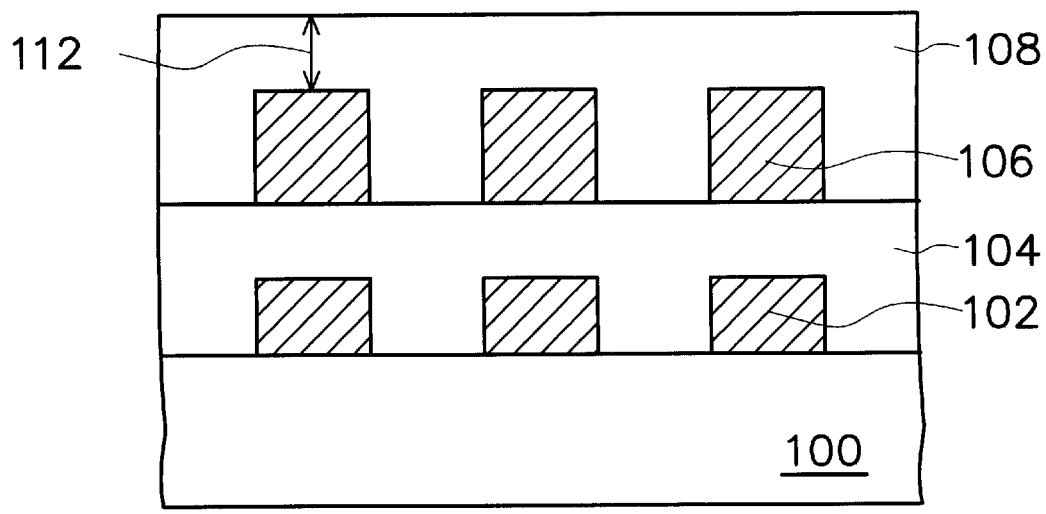
Figure 1C:
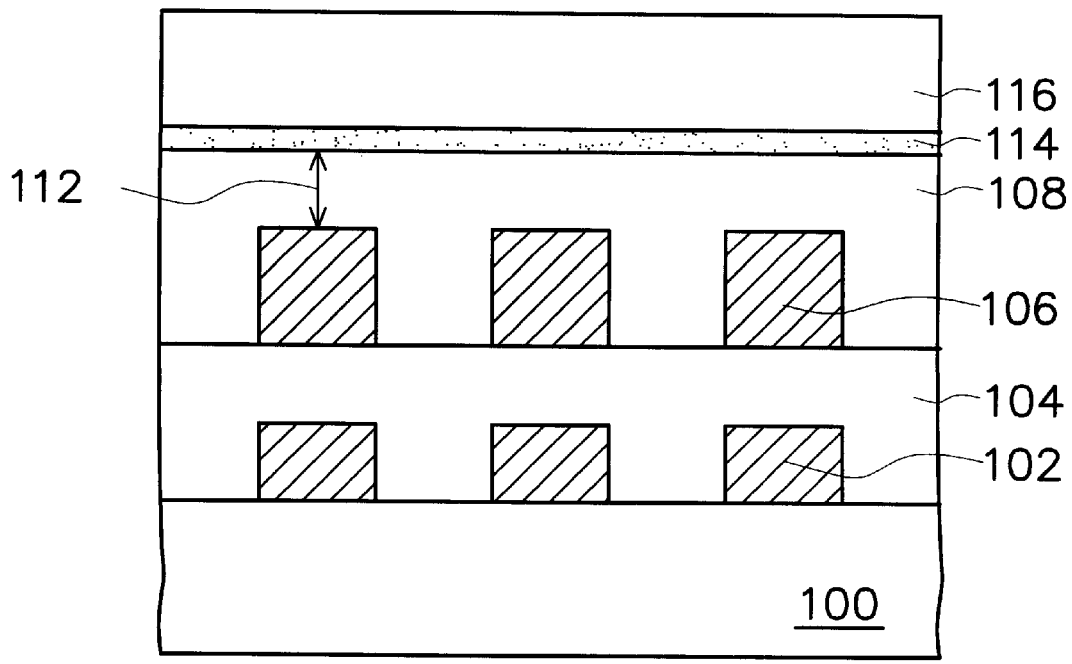
Figure 2A:
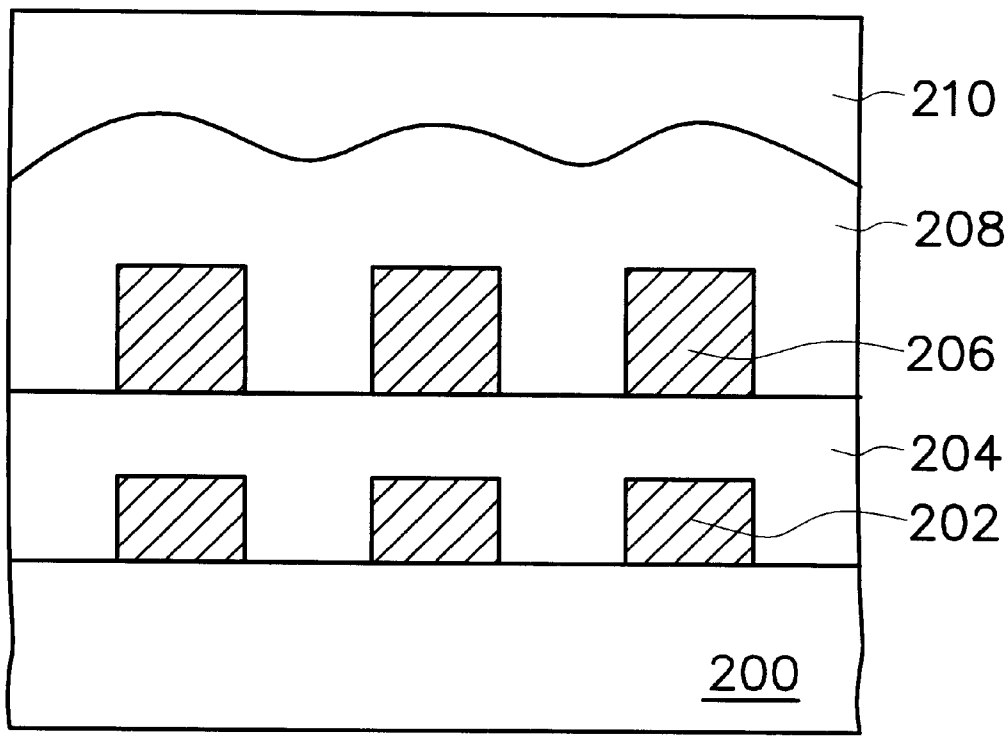
FIG. 2A through FIG. 2C are schematic, cross-sectional views showing a process for forming a second inter-poly dielectric layer according to the invention.
Figure 2B:
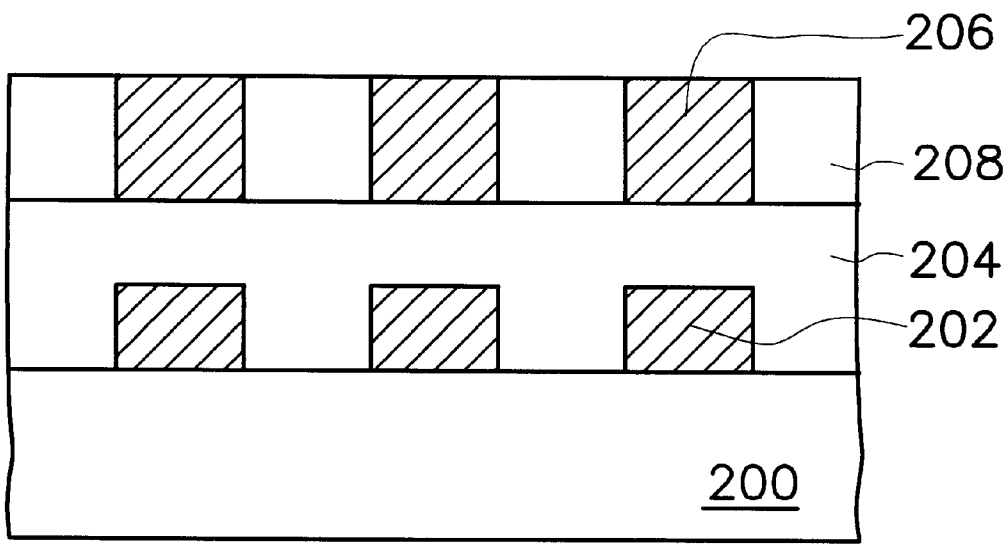
Figure 2C:
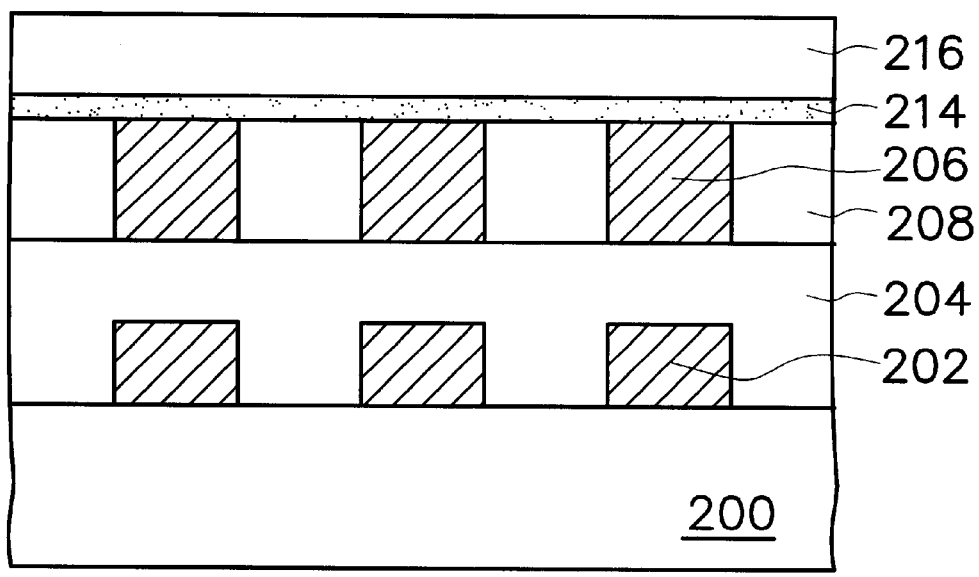

FIG. 2A through FIG. 2C are schematic, cross-sectional views showing a process for forming a second inter-poly dielectric layer according to the invention.

Referring to FIG. 2A, a substrate 200 is provided, and then first polysilicon lines 202 such as word lines, a first inter-layer dielectric layer 204 and second polysilicon lines 206 such as bit lines or capacitors are formed on the substrate 200. A second IPD layer 208 is formed on the resulting structure. For example, a silicon oxide layer is formed as the second IPD layer 208 by an atmospheric chemical vapor deposition to a thickness of about 6000–10000 Å thick. The second IPD layer is preferably about 8000 Å. Due to the difference between the second polysilicon layer 206 and the first inter-layer dielectric layer 204 in height, the second IPD layer 208 as formed has an undulating surface, as shown in FIG. 2A. A SOG layer 210 is then formed by, for example, a typical spin-coating to a thickness of 4000–6000 Å on the second IPD layer 208 to generate a uniform surface. In addition, a borophosphosilicate glass (BPSG) may replace the SOG.

Referring to FIG. 2B, using a top surface of the second polysilicon layer 206 as an etching end point, the SOG layer 210 and the second IPD layer 208 are etched back until the second polysilicon layer 206 is exposed. Preferably, in this embodiment, the SOG layer 210 is entirely removed while the second IPD layer is partially removed and levels with the second polysilicon layer 206. The second IPD layer 208 is the planarized. The method using the second polysilicon layer 206 as the etching end point is, for example, end point detection. For example, the signal of carbon monoxide (CO) at the wavelength of 219 nm is monitored in the method. Once the second polysilicon layer 206 is exposed during etching, the intensity of the signal fluctuates and the etching stops. The end point detection can accurately control the etching end point at which the second polysilicon layer 206 is exposed.

When the second IPD layer 208 is etched back, once the second polysilicon layer 206 is exposed, the intensity of the signal of carbon monoxide (CO) at the wavelength of 219 nm decreases and the etching exactly stops on the second polysilicon layer 206. Therefore, no matter how the thickness of the second IDP layer 208 and the thickness SOG layer 210 are changed, or how the etching rate is changed, the result is not influenced thereby. Thus, the thickness of the second IPD layer is accurately controlled.

Referring to FIG. 2C, a cover layer 214 and an oxide layer 216 are formed on the resulting structure in sequence; thus, an inter-layer dielectric layer is formed. The cover layer 214 is, for example, a silicon nitride layer formed by a chemical vapor deposition (CVD) to a thickness of about 60–100 Å, and preferably about 86 Å. The oxide layer 216 is formed by, for example, a LPCVD to a thickness of about 1000–3000 Å, and preferably about 2000 Å.

Conventionally, in etching the second IPD layer back, since the etching end point is determined by the time mode which is readily influenced by deviation in deposited thickness and improper control in etching rate, the desired thickness of the etched second IPD layer is not attained. If the thickness of the dielectric layer on the second polysilicon layer is increased, the difficulty for subsequently etching the dielectric layer is increased because the etching depth is increased.

According to this invention, the second IPD layer is etched back while employing end point detection. End point detection can accurately control the etching end point at which the second polysilicon layer is exposed, prevent the second IPD layer from being lower than the second polysilicon layer due to deviation in process, and does not increase the thickness of the second IPD layer and the etching depth of etching the dielectric layer. Although the end point detection has been applied to other semiconductor processes, this is the first application of end point detection to the process of etching the second IPD layer back.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming an inter-layer dielectric layer, comprising:
    providing a substrate on which a plurality of first polysilicon lines, a first inter-layer dielectric layer on the substrate and the first polysilicon lines, and a plurality of second polysilicon lines on the first inter-layer dielectric layer are formed;
    forming a second inter-layer dielectric layer to cover the second polysilicon lines and fill spaces between the second polysilicon lines;
    forming a spin-on glass layer on the second inter-layer dielectric layer;
    etching back the spin-on glass layer and the second inter-layer dielectric layer using a top surface of the second polysilicon lines as etching end points;
    forming a cover layer on the second polysilicon lines and portions of the second inter-layer dielectric layer remaining between the second polysilicon lines; and
    forming an oxide layer on the cover layer.

2. The method of claim 1, wherein the second inter-layer dielectric layer comprises a silicon oxide layer having a thickness of about 6000–10000 Å.

3. The method of claim 1, wherein the method to form the second inter-layer dielectric layer comprises atmospheric chemical vapor deposition.

4. The method of claim 1, wherein the spin-on glass layer has a thickness of about 4000–6000 Å.

5. The method of claim 1, wherein a borophosphosilicate glass can replace the spin-on glass layer.

6. The method of claim 1, wherein the cover layer has a thickness of about 60–100 Å.

7. The method of claim 1, wherein the oxide layer has a thickness of about 1000–3000 Å.

8. The method of claim 1, wherein the method to form the oxide layer comprises a low pressure chemical vapor deposition.

9. The method of claim 1, wherein the method adopted to etch the spin-on glass layer and the second inter-layer dielectric layer using the upper surface of the second polysilicon lines as etching end points includes end point detection.

10. The method of claim 9, wherein the method adopted to etch the spin-on glass layer and the second inter-layer dielectric layer, while using the upper surface of the second polysilicon lines as etching end points, comprises monitoring a signal of carbon monoxide at a wavelength of 219 nm so that once the second polysilicon lines are exposed an intensity of the signal is changed and the etching is stopped.

11. A method for forming an inter-layer dielectric layer comprising:
    providing a substrate on which a plurality of first polysilicon lines, a first inter-layer dielectric layer, and a plurality of second polysilicon lines are formed;
    forming a second inter-layer dielectric layer to cover the second polysilicon lines and fill spaces between the second polysilicon lines;
    forming a spin-on glass layer on the second inter-layer dielectric layer;
    etching the spin-on glass layer and the second inter-layer dielectric layer until the second polysilicon lines is exposed;
    forming a cover layer on the second polysilicon lines and a remainder of the second inter-layer dielectric layer; and
    forming an oxide layer on the cover layer.

12. The method of claim 11, wherein the method adopted to etch the spin-on glass layer and the second inter-layer dielectric layer, while using the upper surface of the second polysilicon lines as etching end points, comprises monitoring a signal of carbon monoxide at a wavelength of 219 nm so that once the second polysilicon lines are exposed, an intensity of the signal is changed and the etching is stopped.

13. The method of claim 11, wherein the second inter-layer dielectric layer comprises a silicon oxide layer having a thickness of about 6000–10000 Å.

14. The method of claim 11, wherein the method to form the second inter-layer dielectric layer comprises an atmospheric chemical vapor deposition.

15. The method of claim 11, wherein the spin-on glass layer has a thickness of about 4000–6000 Å.

16. The method of claim 11, wherein a borophosphosilicate glass can replace the spin-on glass layer.

17. The method of claim 11, wherein the cover layer has a thickness of about 60–100 Å.

18. The method of claim 11, wherein the oxide layer has a thickness of about 1000–3000 Å.

19. The method of claim 11, wherein the method to form the oxide layer comprises a low pressure chemical vapor deposition.

20. A method for forming an inter-layer dielectric layer, comprising:

providing a substrate on which a plurality of first polysilicon lines, a first interlayer dielectric layer on the substrate and the first polysilicon line, and a plurality of second polysilicon lines on the first inter-layer dielectric layer are formed;

forming a second inter-layer dielectric layer to cover the second polysilicon lines and fill spaces between the second polysilicon lines;

forming a spin-on glass layer on the second inter-layer dielectric layer;

etching back the spin-on glass layer and the second dielectric layer until the spin-on glass is completely removed and the second dielectric layer is partially removed using a top surface of the second polysilicon lines as an etching end point;

forming a cover layer on the second polysilicon lines and on the second inter-layer dielectric layer between the second polysilicon lines; and forming an oxide layer on the cover layer.

21. The method of claim 20, wherein the etching of the spin-on glass layer and the second inter-layer dielectric layer comprising:

monitoring a signal of carbon monoxide;

stopping the etching when an intensity of the signal is changed.

22. The method of claim 21, wherein the signal of carbon monoxide is at a wavelength of 219 nm.

23. A fabrication method for an inter-layer dielectric layer comprising:

providing a substrate on which a plurality of first polysilicon lines, a first interlayer dielectric layer, and a plurality of second polysilicon lines are formed thereon;

forming a second inter-layer dielectric layer on the second polysilicon lines and fill spaces between the second polysilicon lines;

forming a spin-on glass layer on the second inter-layer dielectric layer;

etching the spin-on glass layer and the second inter-layer dielectric layer until an intensity of a signal of carbon monoxide monitored at a wavelength 219 nm has changed; and forming a cover layer on the second polysilicon lines and on a remainder of the second inter-layer dielectric layer.

24. The method of claim 23, wherein the intensity of the signal of carbon monoxide monitored at a wavelength 219 nm has changed when the second polysilicon lines are exposed.

* * * * *